(12) United States Patent
Kim et al.

(10) Patent No.: US 7,488,976 B2
(45) Date of Patent: Feb. 10, 2009

(54) ORGANIC LIGHT EMITTING DEVICE

(75) Inventors: Changnam Kim, Seoul (KR); Myeon Chang Sung, Seoul (KR); Sangkyoon Kim, Hanam-si (KR); Sun Kil Kang, Anyang-si (KR); Won Jae Yang, Gimpo-si (KR); Honggyu Kim, Uiwang-si (KR); Young Hoon Shin, Seoul (KR); Do Youl Kim, Seoul (KR); Honyun Lee, Gyeonggi-do (KR); Myung Jong Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 131 days.

(21) Appl. No.: 11/702,207

(22) Filed: Feb. 5, 2007

(65) Prior Publication Data

US 2007/0194307 A1 Aug. 23, 2007

(30) Foreign Application Priority Data

Feb. 6, 2006 (KR) ............... 10-2006-0011303

(51) Int. Cl.
*H01L 29/08* (2006.01)
(52) U.S. Cl. .................... 257/40; 257/99
(58) Field of Classification Search ............ 257/40, 257/99, 59, 72
See application file for complete search history.

(56) References Cited

U.S. PATENT DOCUMENTS 6,727,645 B2 * 4/2004 Tsujimura et al. ........... 313/504

* cited by examiner

*Primary Examiner*—Mark Prenty
(74) *Attorney, Agent, or Firm*—Morgan Lewis & Bockius LLP

(57) ABSTRACT

Provided is an organic light emitting device comprising: a substrate; and a plurality of sub-pixels, each sub-pixel comprising a thin film transistor formed on the substrate; a planarization layer formed on the thin film transistor, and having a contact hole exposing a portion of a source electrode or a drain electrode of the thin film transistor; a contact electrode formed on the planarization layer, and electrically connected with the source electrode or the drain electrode of the thin film transistor through the contact hole; a first electrode spaced apart from the contact electrode, the first electrode formed on the planarization layer; an insulating layer formed on the first electrode and the contact electrode, the insulating layer comprising a first opening exposing a portion of the first electrode and a second opening exposing a portion of the contact electrode; a light emitting layer formed in the first opening; a second electrode formed on the light emitting layer and electrically connected with a portion of the contact electrode through the second opening.

18 Claims, 9 Drawing Sheets

ORGANIC LIGHT EMITTING DEVICE

This Nonprovisional application claims priority under 35 U.S.C. § 119(a) on patent application Ser. No. 10-2006-0011303 filed in Korea on Feb. 6, 2006, filed in Korea on the entire contents of which are hereby incorporated by reference.

BACKGROUND

1. Field

The present invention relates to an organic light emitting device and a method for manufacturing the same.

2. Description of the Background Art

Organic Light emitting device (OLED) refers to a device for injecting electrons and holes from an electron injection cathode and a hole injection anode into a light emitting layer, respectively, and emitting light when excitons, which are combinations of the injected electrons and holes, are transited from an excited state to a ground state.

The organic light emitting device is classified into a Passive Matrix Organic Light emitting device (PMOLED) and an Active Matrix Organic Light emitting device (AMOLED) depending on its driving method. A thin film transistor for driving the active matrix organic light emitting device is classified into several kinds depending on its forming method and material, such as amorphous silicon (a-Si) and polycrystalline silicon (p-Si, Low Temperature polycrystalline Silicon: LTPS).

The active matrix organic light emitting device using a polycrystalline silicon thin film transistor has a disadvantage that its cost competence is very low compared with the a-Si.

The active matrix organic light emitting device using an amorphous silicon thin film transistor has an excellent cost competence compared with the p-Si, but has a disadvantage that a cathode should connect with a source or drain electrode and an organic light emitting diode should be inversely formed since the active matrix organic light emitting device is of a source type.

A drawback of the conventional organic light emitting device will be described with reference to FIGS. 1A and 1B.

FIG. 1A is a cross-sectional view illustrating conventional organic light emitting device. FIG. 1B is a cross-sectional view illustrating organic layer of conventional organic light emitting device of FIG. 1A.

As shown in FIGS. 1A and 1B, in the conventional organic light emitting device 100, a thin film transistor 130 and a light emitting diode 140 are formed on a substrate 110. A passivation layer 160 is formed and covers the thin film transistor 130 and the light emitting diode 140. A cover substrate 120 is provided and protects a device formed on the substrate 110. The substrate 110 and the cover substrate 120 are sealed using sealant 170. When the organic light emitting device 100 is a top emission type, the cover substrate 120 is formed of transparent glass.

In detail, a gate electrode 131 is formed on the substrate 110 and a gate insulating layer 132 is formed on the substrate 110 comprising the gate electrode 131. An active layer 133 is formed of amorphous silicon on the gate insulating layer 132. Ohmic contact layers 134 are formed on both sides of the active layer 133. A source 135 and a drain 136 are formed on the ohmic contact layers 134, thereby constituting the thin film transistor 130.

A planarization layer 150 is formed on the thin film transistor 130 so that a light emitting diode 140 can be formed uniformly over the thin film transistor 130. The planarization layer 150 has a contact hole for electrically connecting the underlying thin film transistor 130 with light emitting diode 140. A cathode 141 is formed on the planarization layer 150, and connected with the drain 136 of the thin film transistor 130 through the contact hole.

An Organic layer 143 is formed on the cathode 141, and an anode 144 is formed on the organic layer 143, thereby constituting the light emitting diode 140. The light emitting diode 140 emits light by driving the thin film transistor 130. As shown in FIG. 1B, the organic layer 143 comprises an emission layer (EML) 143c formed of an organic material and further comprises a hole injection layer (HIL) 143e and/or a hole transport layer (HTL) 143d between the emission layer 143c and the anode 144, an electron transport layer (ETL) 143b and/or an electron injection layer 143a (EIL) between the emission Layer 143c and the cathode 141. The organic layer 143 is formed on a portion of the cathode 141 exposed by the insulating layer 142.

In the above organic light emitting device 100, the light emitting diodes 140 should be all formed inversely (generally, in case of inverted top type) because the thin film transistor 130 comprises amorphous silicon layer. In general, the cathode 141 is formed of aluminum (Al). It is difficult to apply the aluminum (Al) to a device because oxide is generated when the cathode 141 is patterned by photolithography process or deposited under atmosphere.

Therefore, in an alternative manner, after forming a metal layer for the cathode 141 under vacuum, the organic layer 143 is formed on the metal layer for cathode 141 under vacuum and directly, and the cathode 141 is formed by the pattering the metal layer. Then, there occurs a drawback that it is impossible to form the cathode pattern.

In addition, in case of inverted top type OLED, the anode 144 is formed using a thin metal layer or a conductive material (Indium Tin Oxide: ITO). In this case, there occurs a drawback that the organic layer 143 of the light emitting diode 140 is damaged when the anode 144 is formed by sputtering using conductive material.

SUMMARY

In one aspect, there is provided an organic light emitting device comprising: a substrate; and a plurality of sub-pixels, each sub-pixel comprising a thin film transistor formed on the substrate; a planarization layer formed on the thin film transistor, and having a contact hole exposing a portion of a source electrode or a drain electrode of the thin film transistor; a contact electrode formed on the planarization layer, and electrically connected with the source electrode or the drain electrode of the thin film transistor through the contact hole; a first electrode spaced apart from the contact electrode, the first electrode formed on the planarization layer; an insulating layer formed on the first electrode and the contact electrode, the insulating layer comprising a first opening exposing a portion of the first electrode and a second opening exposing a portion of the contact electrode; an emitting layer formed in the first opening; a second electrode formed on the light emitting layer and electrically connected with a portion of the contact electrode through the second opening.

In another aspect, there is provided An organic light emitting device comprising: a substrate; and a plurality of sub-pixels, each sub-pixel comprising a thin film transistor formed on the substrate; a planarization layer formed on the thin film transistor, and having a contact hole exposing a portion of a source electrode or a drain electrode of the thin film transistor; a first electrode formed on the planarization layer; an insulating layer formed on the first electrode and the contact electrode, the insulating layer comprising an opening exposing a portion of the first electrode; a light emitting layer formed in the first opening; a second electrode formed on the emitting layer and electrically connected with a portion of the contact electrode through the contact hole.

It is to be understood that both the foregoing general description and the following detailed description are exemplary and explanatory and are intended to provide further explanation of the invention as claimed.

BRIEF DESCRIPTION OF THE DRAWINGS

The invention will be described in detail with reference to the following drawings in which like numerals refer to like elements.

DESCRIPTION OF EMBODIMENTS

Embodiments of the present invention will be described in a more detailed manner with reference to the drawings.

First Embodiment

Figure 1A:
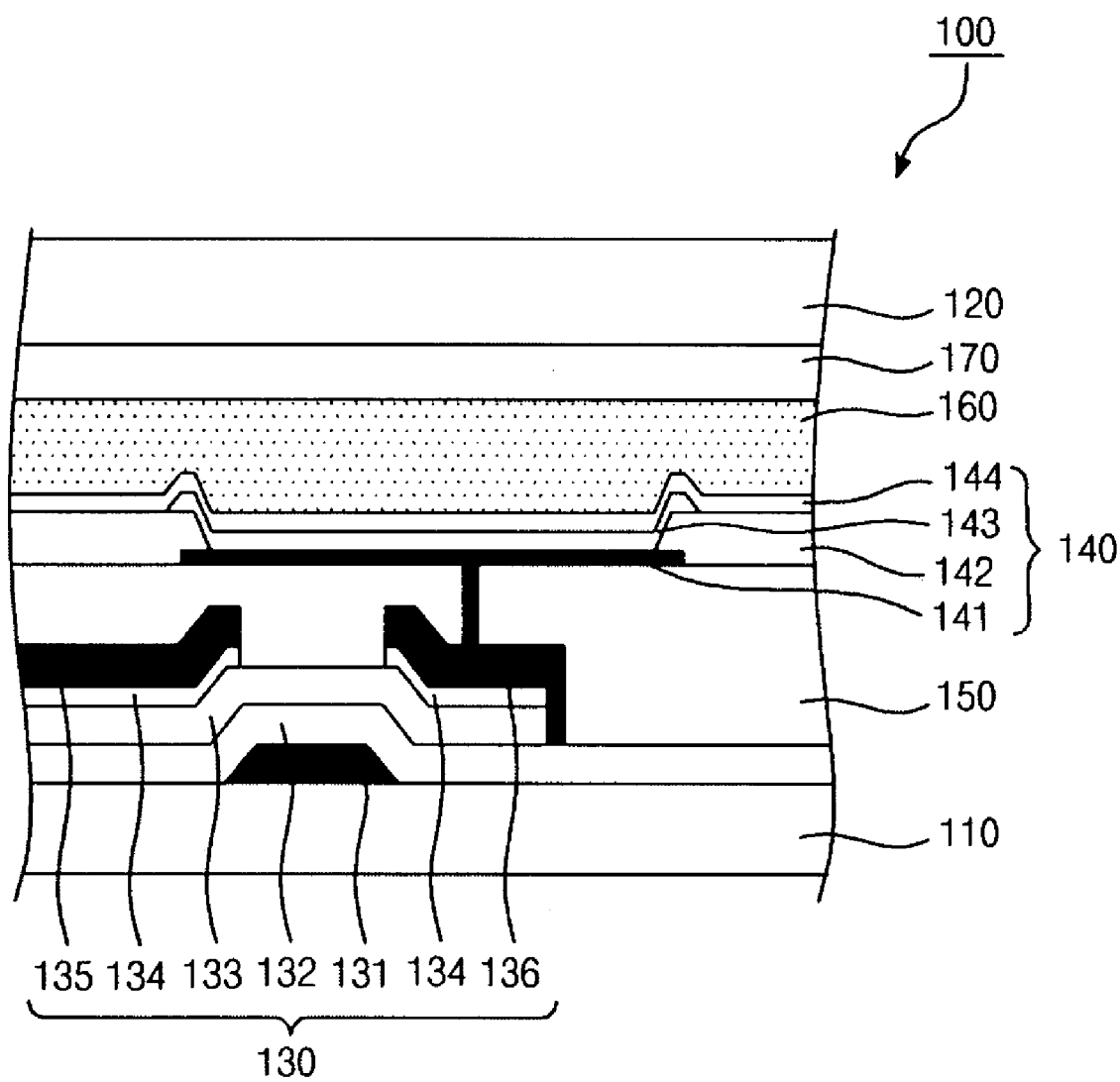
FIG. 1A is a cross-sectional view illustrating conventional organic light emitting device.
Figure 1B:
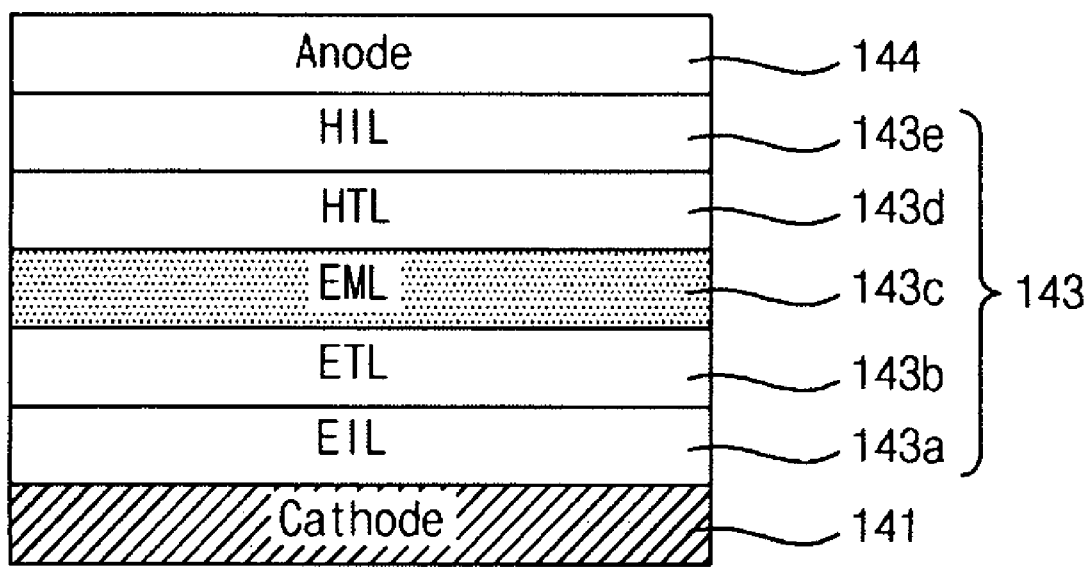
FIG. 1B is a cross-sectional view illustrating organic layer of conventional organic light emitting device of FIG. 1A.
Figure 2A:
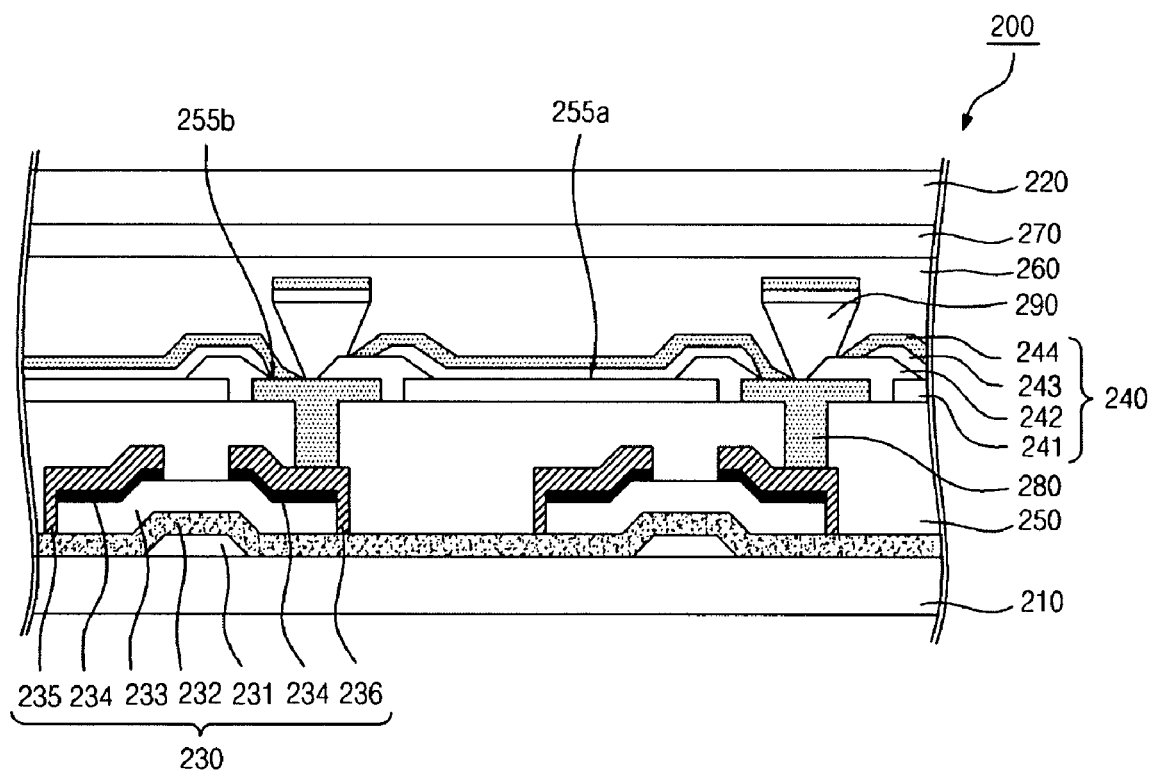
FIG. 2A is a cross-sectional view illustrating an organic light emitting device according to a first embodiment of the present invention.
Figure 2B:
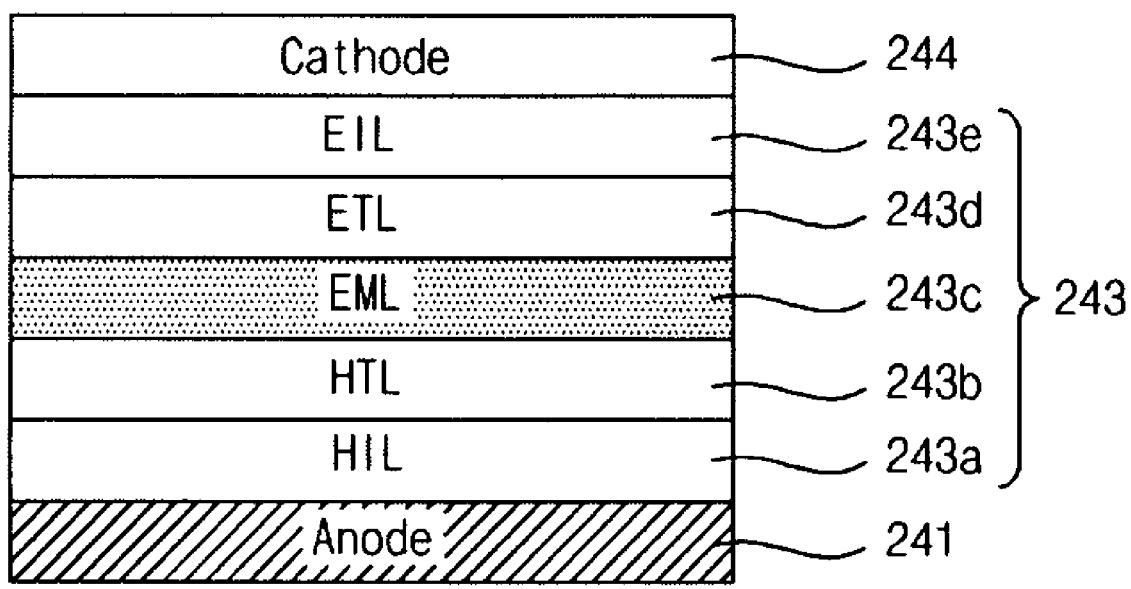
FIG. 2B is a cross-sectional view illustrating organic layer of a light emitting layer of FIG. 2A.
Figure 2C:
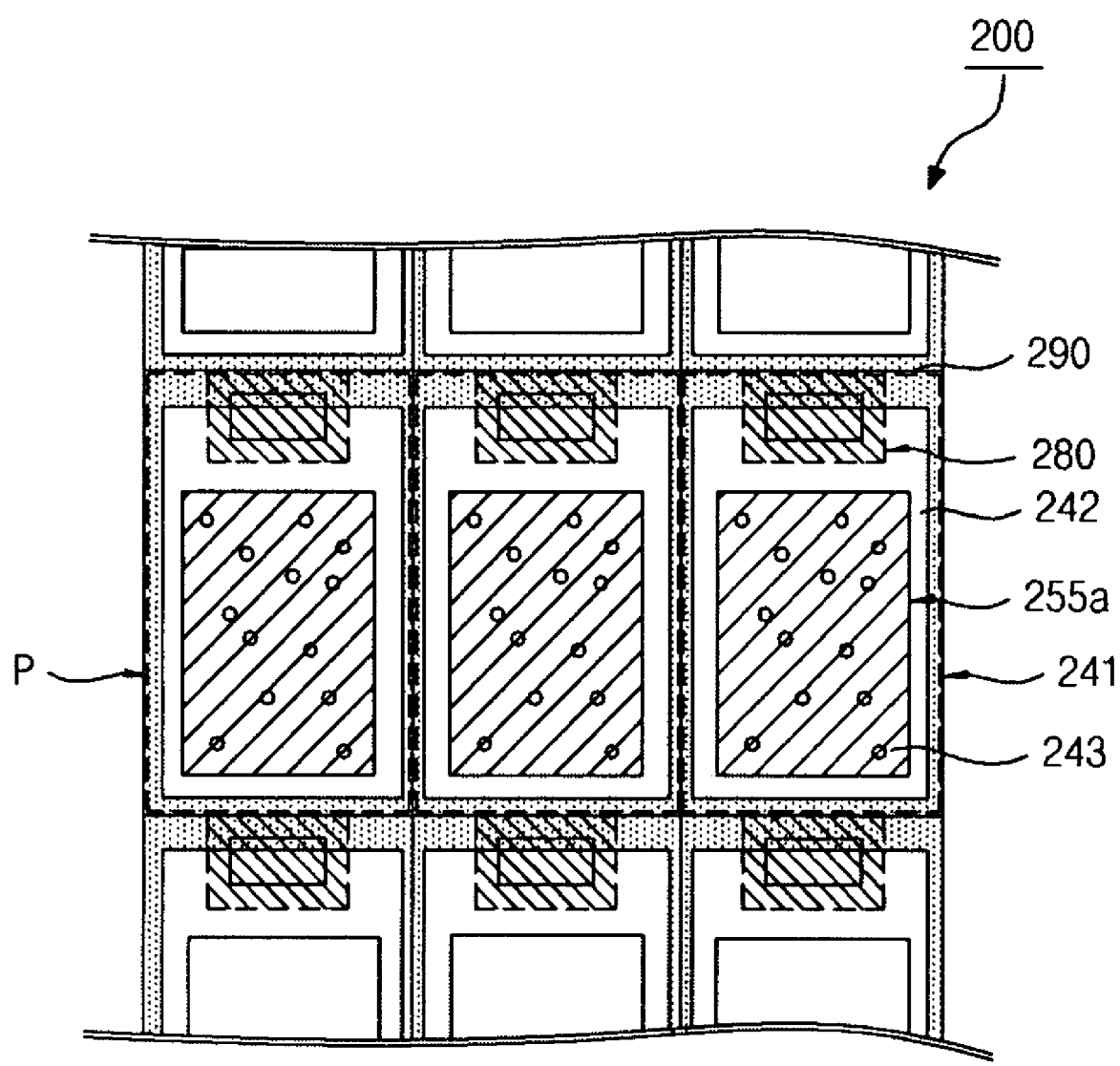
FIGS. 2C and 2D are plan views illustrating a portion of FIG. 2A.
Figure 2D:
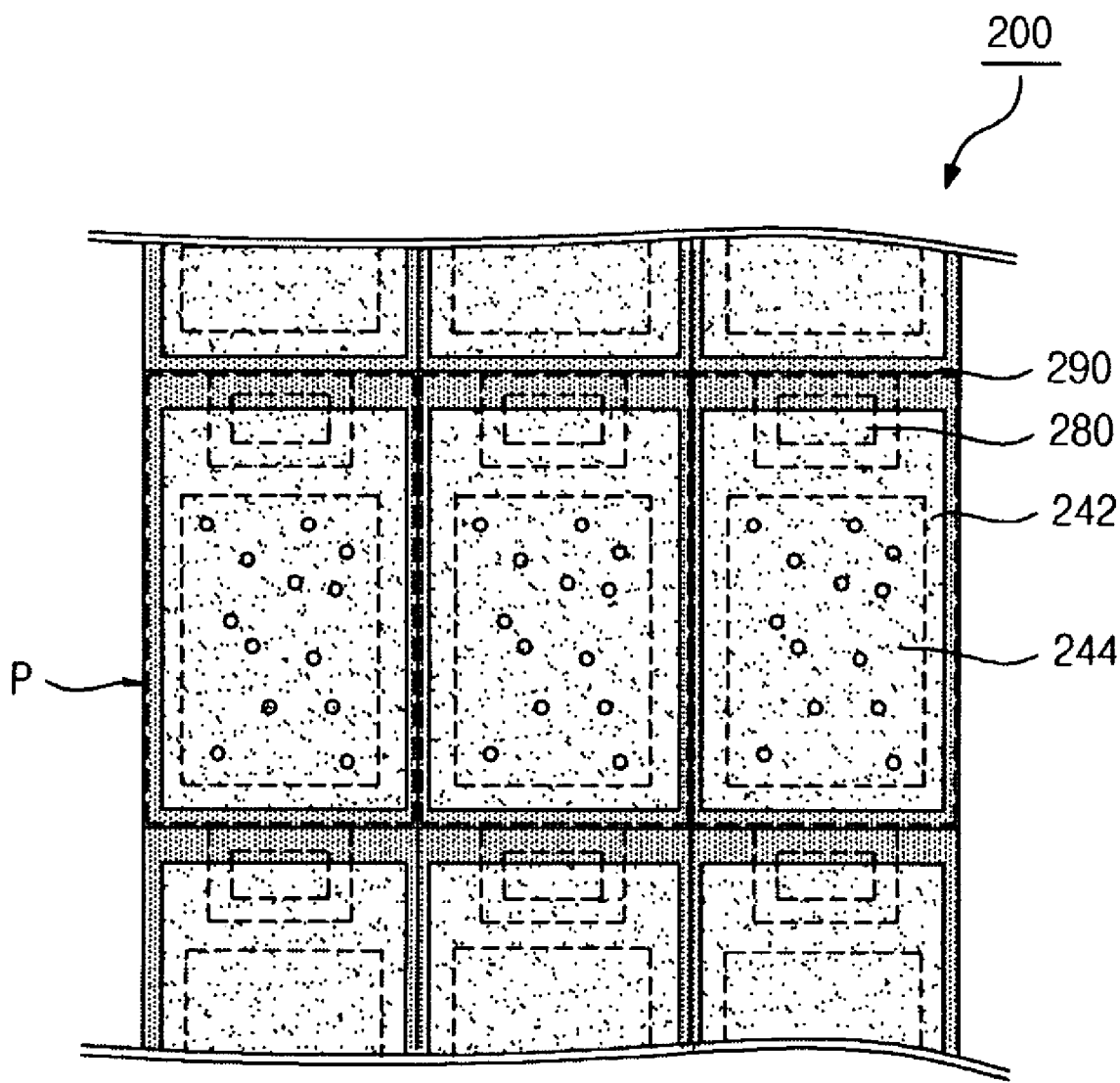

FIG. 2A is a cross-sectional view illustrating an organic light emitting device according to a first embodiment of the present invention. FIG. 2B is a cross-sectional view illustrating organic layer of a light emitting layer of FIG. 2A. FIGS. 2C and 2D are plan views illustrating a portion of FIG. 2A Referring to FIGS. 2A to 2D, in an organic light emitting device 200 according to the present invention, a thin film transistor 230 is formed on a substrate 210. In detail, a gate electrode 231 is formed on the substrate 210. A gate insulating layer 232 is formed on the gate electrode 231. An active layer 233 is formed of amorphous silicon on the gate insulating layer 232. Ohmic contact layers 234 are formed on both sides of the active layer 233. A source electrode 235 and a drain electrode 236 are formed on the ohmic contact layers 234, respectively.

The planarization layer 250 is formed on the thin film transistor 230 so that the light emitting diode 240 can be uniformly formed over the thin film transistor 230. The planarization layer 250 may comprise an organic material, for example, poly acryl resin, BCB (benzocyclobutene) resin or polyimide resin.

The planarization layer 250 comprises a contact hole exposing a portion of the drain electrode 236 in the planarization layer 250. The contact electrode 280 is formed on the planarization layer 250 and the contact electrode 280 is connected with a portion of the drain electrode 236 through the contact hole.

A first electrode 241 is formed on the planarization layer 250 and spaced apart the contact electrode 280. The first electrode 241 may be an anode and a common electrode.

An insulating layer 242 is formed on the first electrode 241 and the contact electrode 280. The insulating layer 242 comprises a first opening 255a exposing a portion of the first electrode 241 and a second opening 255b exposing a portion of the contact electrode 280.

A barrier rib 290 is formed on an exposed portion of the contact electrode 280 and the insulating layer 242. The barrier rib 290 may be reverse-tapered. Referring to FIG. 2C, the barrier rib 290 may be formed in mesh type format so that lights emitting from each sub-pixel do not interfere with each other.

An Organic layer 243 is formed in the first opening 255a on the exposed first electrode 241. The organic layer 243 comprises at least an emission layer (EML) 243c. Referring to FIG. 2B, the organic layer 243 may be multiple layers, the organic layer 243 further comprises a hole injection Layer (HIL) 243a, a hole transport layer (HTL) 243b, an electron transport layer (ETL) 243d, and an electron injection Layer (EIL) 243e, at least one of which is formed of an organic material, for example, the emission Layer (EML) 234c comprises an organic material.

A second electrode 244 is formed on the organic layer 243 and electrically connected with the contact electrode 280 through the opening 255b. The second electrode 244 may be a cathode. The second electrode 244 is connected to the drain electrode 236 through the contact electrode 280. Referring to FIG. 2D, it can be appreciated that the second electrode 244 is deposited on the portion of the contact electrode 280 and isolated using the barrier rib 290 in case where the second electrode 244 is formed on an entire surface of the organic layer 243.

The organic layer 243 and the second electrode 244 are deposited by evaporation method in vacuum chamber. Thus, the second electrode 244 is formed to contact with the exposed portion of the contact electrode 280 on the organic layer 243 by controlling the angle between the evaporation source, which contains a material for second electrode 244 and the substrate 210.

A passivation layer 260 is formed over the thin film transistor 230 and the light emitting diode 240. A cover substrate 220 is provided and protects a device formed on the substrate 210. The substrate 210 and the cover substrate 220 are sealed using a sealant 270. The sealant 270 may be a face sealant composed of a transparent material.

In the structure as above, the barrier rib 290 is formed on the contact electrode 280, thereby facilitating the deposition of the second electrode 244 on the portion of the contact electrode 290 when the second electrode 244 is formed on the light emitting layer 243. Instead of the barrier rib 290, a mask can be used to deposit the second electrode 244 on the portion of the contact electrode 280. However, in view of a process convenience, the forming of the barrier rib 290 and the depositing of the second electrode 244 on an entire surface of the resultant comprising the barrier rib 290 rather make it easy to isolate the second electrode 244 on the contact electrode 280.

In the organic light emitting device 200 according to the first embodiment, the light emitting diode 240 can be formed in the normal top form even though the thin film transistor 230 comprises the amorphous silicon layer. The second electrode 244 is electrically connected to the contact electrode 280 connecting with the drain electrode 236 of the thin film transistor 230.

Thus, in the present invention, the light emitting diode can be formed in the normal top type even with the use of the thin film transistor comprising an amorphous silicon layer. Accordingly, according to the first embodiment, it may decrease cost and tact time for manufacturing process.

Second Embodiment

Figure 3:
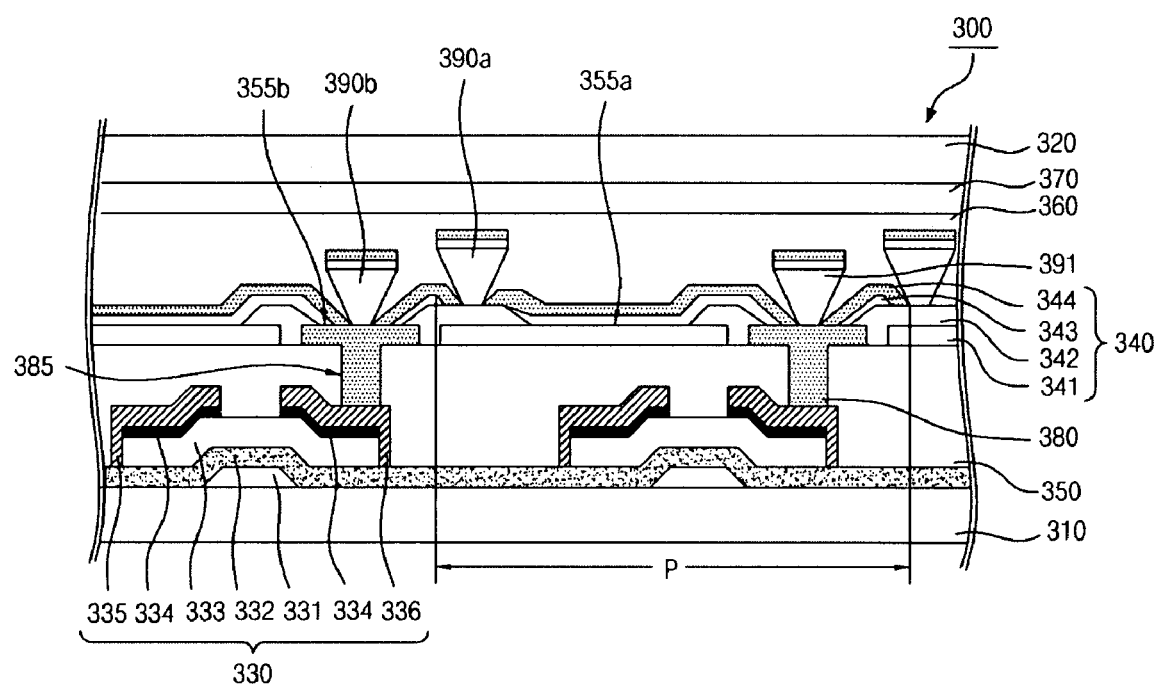
FIG. 3 is a cross-sectional view illustrating an organic light emitting device according to a second embodiment of the present invention.

FIG. 3 is a cross-sectional view illustrating an organic light emitting device according to a second embodiment of the present invention.

Referring to FIG. 3, in the organic light emitting device 300 according to a second embodiment of the present invention, a thin film transistor 330 is formed on a substrate 310. In detail, the thin film transistor 330 comprises a gate electrode 331, a gate insulating layer 332, an active layer 333, ohmic contact layers, a source electrode 335 and a drain electrode 336.

The planarization layer 350 is formed on the thin film transistor 330. The planarization layer 350 comprises a contact hole exposing a portion of the drain electrode 336 in the planarization layer 350. The contact electrode 380 is formed on the planarization layer 350 and The contact electrode 380 is connected with a portion of the drain electrode 336 through the contact hole.

A first electrode 341 is formed on the planarization layer 350 and spaced apart the contact electrode 380. The first electrode 341 may be an anode and a common electrode.

An insulating layer 342 is formed on the first electrode 341 and the contact electrode 380. The insulating layer 342 comprises a first opening 355a exposing a portion of the first electrode 341 and a second opening 355b exposing a portion of the contact electrode 380.

A fist barrier rib 390a is formed on the insulating layer 342 and a second barrier rib 390b is an exposed portion of the contact electrode 380. The first and second barrier ribs 390a and 390b may be reverse-tapered.

An Organic layer 343 is formed in the first opening 355a on the exposed first electrode 341. A second electrode 344 is formed on the organic layer 343 and electrically connected with the contact electrode 380 through the second opening 355b. The second electrode 344 may be a cathode. The second electrode 344 is patterned by the first barrier rib 390a and connected to the contact electrode 380by the second barrier rib 390b.

A passivation layer 360 is formed over the thin film transistor 330 and the light emitting diode 340. The substrate 310 and the cover substrate 320 are sealed using a sealant 370.

Third Embodiment

Figure 4A:
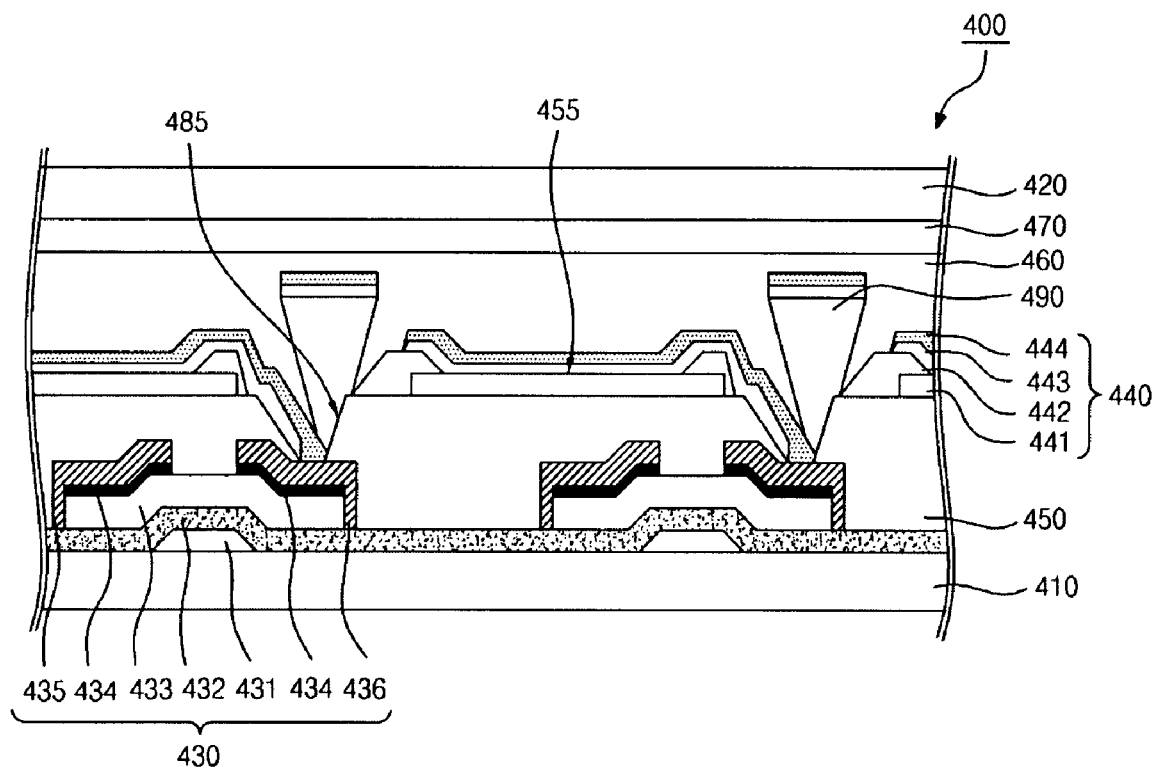
FIGS. 4A and 4B are a cross-sectional view and a plan view illustrating an organic light emitting device according to a third embodiment of the present invention.
Figure 4B:
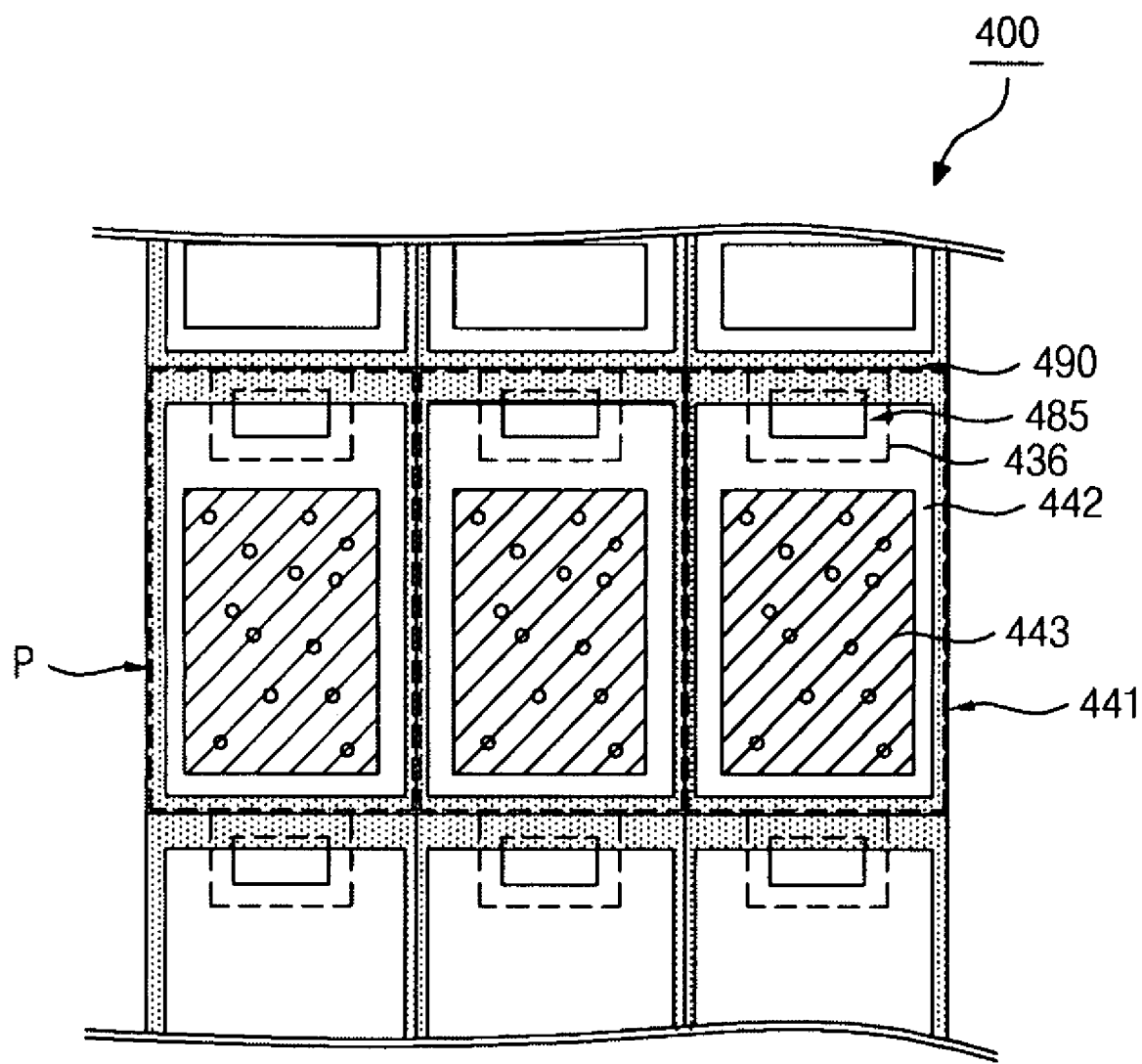

FIGS. 4A and 4B are a cross-sectional view and a plan view illustrating an organic light emitting device according to a third embodiment of the present invention.

Referring to FIGS. 4A and 4B, in the organic light emitting device 400 according to a second embodiment of the present invention, a thin film transistor 430 is formed on a substrate 410. In detail, the thin film transistor 430 comprises a gate electrode 431, a gate insulating layer 432, an active layer 433, ohmic contact layers, a source electrode 435 and a drain electrode 436.

The planarization layer 450 is formed on the thin film transistor 430. The planarization layer 450 comprises a contact hole 485 exposing a portion of the drain electrode 436 in the planarization layer 450.

A first electrode 441 is formed on the planarization layer 450. The first electrode 441 may be an anode and a common electrode.

An insulating layer 442 is formed on the first electrode 441 to expose a portion of the contact hole 485. And, the insulating layer 442 comprises an opening 455 exposing a portion of the first electrode 441.

A barrier rib 490 is formed in the contact hole 485 to expose a portion of the drain electrode 436. The barrier rib 490 may be reverse-tapered and the barrier rib 490 is formed to contact a portion of the planarization layer 450 in the contact hole 485.

An Organic layer 443 is formed in the first opening 455a on the exposed first electrode 441. The Organic layer 443 comprises at least an emitting layer and the organic layer 443 further comprises a hole injection layer (HIL), a hole transport layer (HTL), an electron transport layer (ETL), and an electron injection layer (EIL), at least one of which is formed of an organic material, for example, the emission Layer (EML) comprises an organic material.

A second electrode 444 is formed on the organic layer 443 and electrically connected with the drain electrode 436 through the contact hole 485. The second electrode 444 may be a cathode. The second electrode 444 is patterned in each sub-pixel by the barrier rib 490, and connected to the drain electrode 436 by the barrier rib 490.

A passivation layer 460 is formed over the thin film transistor 430 and the light emitting diode 440. The substrate 410 and the cover substrate 420 are sealed using a sealant 470.

Thus, in the third embodiment of the present invention, the light emitting diode can be formed in the normal top form even with the use of the thin film transistor comprising the amorphous silicon layer. Accordingly, the third embodiment of the present invention may decrease cost and tact time in manufacturing process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An organic light emitting device comprising:
a substrate; and
a plurality of sub-pixels, each sub-pixel comprising
a thin film transistor formed on the substrate;
a planarization layer formed on the thin film transistor, and having a contact hole exposing a portion of a source electrode or a drain electrode of the thin film transistor;
a contact electrode formed on the planarization layer, and electrically connected with the source electrode or the drain electrode of the thin film transistor through the contact hole;
a first electrode spaced apart from the contact electrode, the first electrode formed on the planarization layer;
an insulating layer formed on the first electrode and the contact electrode, the insulating layer comprising a first opening exposing a portion of the first electrode and a second opening exposing a portion of the contact electrode;
a light emitting layer formed in the first opening; and
a second electrode formed on the light emitting layer and electrically connected with a portion of the contact electrode through the second opening.

2. The organic light emitting device of claim 1, further comprising a barrier rib formed on a portion of the contact electrode exposed through the second opening and the insulating layer,
wherein the second electrode is patterned by the barrier rib in each sub-pixel.

3. The organic light emitting device of claim 2, wherein the barrier rib is formed on the substrate in a mesh type format.

4. The organic light emitting device of claim 2, wherein the barrier rib is reverse-tapered.

5. The organic light emitting device of claim 1, wherein the first electrode is a common electrode and an anode, and the second electrode is a cathode.

6. The organic light emitting device of claim 1, wherein the thin film transistor comprises an amorphous silicon layer.

7. The organic light emitting device of claim 1, wherein the emitting layer comprises an organic material.

8. The organic light emitting device of claim 1, further comprising a first barrier rib formed on the insulating layer and a second barrier rib formed on a portion of the contact electrode exposed through the second opening,
wherein the second electrode is patterned by the first barrier rib in each sub-pixel and connected to the contact electrode by the second barrier rib.

9. The organic light emitting device of claim 8, wherein the first barrier rib is formed on the substrate in a mesh type format.

10. The organic light emitting device of claim 8, wherein the first and second barrier ribs are reverse-tapered.

11. An organic light emitting device comprising:
a substrate; and
a plurality of sub-pixels, each sub-pixel comprising
a thin film transistor formed on the substrate;
a planarization layer formed on the thin film transistor, and having a contact hole exposing a portion of a source electrode or a drain electrode of the thin film transistor;
a first electrode formed on the planarization layer;
an insulating layer formed on the first electrode, the insulating layer comprising an opening exposing a portion of the first electrode and a portion of the contact hole;
a light emitting layer formed in the first opening; and
a second electrode formed on the light emitting layer and electrically connected with a portion of the source electrode or the drain electrode through the contact hole.

12. The organic light emitting device of claim 11, further comprising a barrier rib formed in the contact hole to expose a portion of a a source electrode or a drain electrode of the thin film transistor,
wherein the second electrode is patterned by the barrier rib in each sub-pixel.

13. The organic light emitting device of claim 12, wherein the barrier rib is formed on the substrate in a mesh type format.

14. The organic light emitting device of claim 12, wherein the barrier rib is reverse-tapered.

15. The organic light emitting device of claim 12, wherein the barrier rib is formed to contact the planarization layer in the contact hole.

16. The organic light emitting device of claim 11, wherein the first electrode is a common electrode and an anode, and the second electrode is a cathode.

17. The organic light emitting device of claim 11, wherein the thin film transistor comprises an amorphous silicon layer.

18. The organic light emitting device of claim 11, wherein the light emitting layer comprises an organic material.

* * * * *